(12) United States Patent
Sawahara

(10) Patent No.: US 11,480,983 B2
(45) Date of Patent: Oct. 25, 2022

(54) REGULATOR CIRCUIT, SEMICONDUCTOR DEVICE AND ELECTRONIC DEVICE

(71) Applicants: Kabushiki Kaisha Toshiba, Tokyo (JP); Toshiba Electronic Devices & Storage Corporation, Tokyo (JP)

(72) Inventor: Yuichi Sawahara, Kawasaki Kanagawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 29 days.

(21) Appl. No.: 16/903,751

(22) Filed: Jun. 17, 2020

(65) Prior Publication Data

US 2021/0089066 A1 Mar. 25, 2021

(30) Foreign Application Priority Data

Sep. 19, 2019 (JP) .............................. JP2019-170661

(51) Int. Cl.
*G05F 1/56* (2006.01)
*H03F 3/45* (2006.01)

(52) U.S. Cl.
CPC ........... *G05F 1/56* (2013.01); *H03F 3/45179* (2013.01)

(58) Field of Classification Search
None
See application file for complete search history.

(56) References Cited

U.S. PATENT DOCUMENTS

| | | | | |
|---|---|---|---|---|
| 6,756,839 | B2* | 6/2004 | Hall | ......................... G06F 1/32 327/538 |
| 7,068,018 | B2* | 6/2006 | Kanakubo | ............... G05F 1/575 323/274 |
| 9,417,646 | B2 | 8/2016 | Yasusaka | |
| 9,753,473 | B2 | 9/2017 | Tan et al. | |
| 9,766,643 | B1* | 9/2017 | Cai | ......................... G05F 1/575 |
| 10,496,118 | B2* | 12/2019 | Sakaguchi | .......... H03F 3/45269 |
| 2010/0045247 | A1* | 2/2010 | Blanken | .................. H03F 3/217 323/273 |
| 2015/0263163 | A1* | 9/2015 | Akimoto | ............. H01L 29/0878 257/339 |
| 2019/0179352 | A1* | 6/2019 | Sakurai | .................... G05F 1/575 |
| 2019/0286182 | A1 | 9/2019 | Sakaguchi | |

FOREIGN PATENT DOCUMENTS

| | | |
|---|---|---|
| EP | 3540556 A1 | 9/2019 |
| JP | 2010-086013 A | 4/2010 |
| JP | 2013-025577 A | 2/2013 |
| JP | 2015-018443 A | 1/2015 |
| JP | 6058805 B2 | 1/2017 |

\* cited by examiner

*Primary Examiner* — Thomas J. Hiltunen
(74) *Attorney, Agent, or Firm* — Allen & Overy LLP

(57) ABSTRACT

A regulator circuit according to one embodiment includes a first transistor, a filter, and a differential amplifier. The first transistor is provided between an input terminal on a power supply side and an output terminal on an output side. The differential amplifier includes an output node connected to the first transistor, and controls the first transistor on the basis of a result of comparison between a reference voltage and a feedback voltage according to an output voltage applied to the output terminal. The filter is connected to a control node that makes a differential pair with the output node, in the differential amplifier.

14 Claims, 11 Drawing Sheets

REGULATOR CIRCUIT, SEMICONDUCTOR DEVICE AND ELECTRONIC DEVICE

CROSS-REFERENCE TO RELATED APPLICATIONS

This application is based upon and claims the benefit of priority from Japanese Patent Application No. 2019-170661, filed on Sep. 19, 2019; the entire contents of which are incorporated herein by reference.

FIELD

Embodiments described herein relate generally to a regulator circuit, a semiconductor device, and an electronic device.

BACKGROUND

In a semiconductor integrated circuit including a regulator circuit provided between an input terminal and an output terminal, an output transistor in the regulator circuit is turned on to conduct between the input terminal and the output terminal.

In such a semiconductor integrated circuit, it is desired to appropriately control the current flowing to the output terminal side through the output transistor in the regulator circuit.

DETAILED DESCRIPTION

According to the present embodiment, there is provided a regulator circuit including a first transistor, a differential amplifier, and a filter. The first transistor is provided between an input terminal on a power supply input side and an output terminal on a power supply output side. The differential amplifier includes an output node connected to the first transistor, and controls the first transistor on the basis of a result of comparison between a reference voltage and a feedback voltage according to an output voltage applied to the output terminal. The filter is connected to a control node that makes a differential pair with the output node, in the differential amplifier.

Hereinafter, a regulator circuit according to an embodiment will be described in detail with reference to the attached drawings. The present invention is not limited to the following embodiments.

Embodiments

Figure 1:
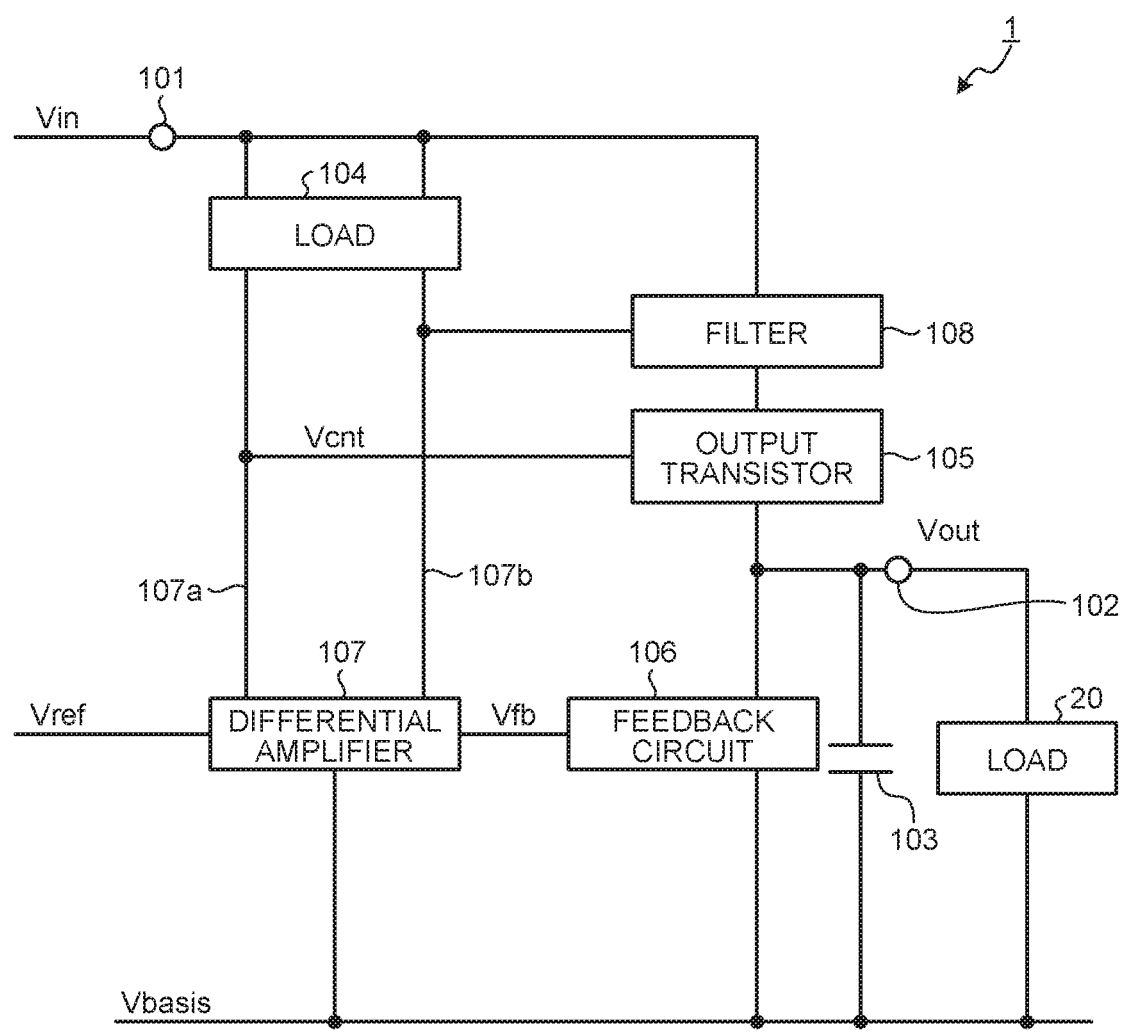
FIG. 1 is a diagram illustrating a configuration of a regulator circuit 1 according to an embodiment.

First, a configuration of a regulator circuit according to an embodiment will be described with reference to FIG. 1. FIG. 1 is a diagram illustrating a configuration of a regulator circuit 1 according to an embodiment. The regulator circuit 1 according to an embodiment is typically classified as a low drop out (LDO) regulator, and is mounted on an integrated circuit. The integrated circuit including the regulator circuit is used as a power supply device for an electronic device (a mobile phone, a smartphone, a laptop personal computer, or the like), for example.

The regulator circuit 1 generates, from the input voltage Vin, an output voltage Vout having a different voltage value. The regulator circuit 1 suppresses an influence of fluctuation of the input voltage Vin, and supplies a stable output voltage Vout to a subsequent circuit.

The regulator circuit 1 includes an input terminal 101, an output terminal 102, an output capacitor 103, a load 104, an output transistor 105 as a first transistor, a feedback circuit 106, a differential amplifier 107, and a filter 108.

The output capacitor 103 is connected to the output terminal 102. The output voltage Vout is supplied to the load 20 connected to the output terminal 102.

In FIG. 1, a potential (reference potential) serving as a voltage reference for the input voltage Vin and the output voltage Vout is set by Vbasis wiring. Vin and Vbasis have a relationship of Vin>Vbasis. Therefore, the positive terminal of the output capacitor 103 is connected to the output terminal 102, and the negative terminal of the output capacitor 103 is connected to Vbasis.

The load 104 is provided between the input voltage Vin and the output transistor 105 and between the input voltage Vin and the differential amplifier 107, and is specifically formed with a cascode current mirror circuit, a diode, a resistor, or the like.

The output transistor 105 is a first transistor provided between the input terminal 101 to which the input voltage Vin is applied and the output terminal 102 (first output terminal) to which the output voltage Vout is applied. The output transistor 105 is formed with a P-channel metal-oxide-semiconductor field-effect transistor (MOSFET), for example, and is typically a complementary MOS (CMOS)

which is a low withstand voltage element having a low withstand voltage, or a lateral diffused MOS (LDMOS) which is a high withstand voltage element having a high withstand voltage.

The input voltage Vin is supplied as a power supply voltage to a source electrode of the output transistor 105. An output signal from the differential amplifier 107 is input to a gate electrode of the output transistor 105. The output terminal 102 is connected to a drain electrode of the output transistor 105. The output transistor 105 adjusts a current flowing between the input terminal 101 and the output terminal 102 on the basis of an output signal from the differential amplifier 107 so that the output voltage Vout is maintained at a predetermined target voltage.

The feedback circuit 106, being connected to the output terminal 102, generates and outputs a feedback voltage Vfb according to the output voltage Vout.

The differential amplifier 107 includes an output node 107a and a control node 107b. The output node 107a and the control node 107b form a differential pair. The output node 107a of differential amplifier 107 is connected to the output transistor 105 as the first transistor. The control node 107b of the differential amplifier 107 is connected to the filter 108.

The differential amplifier 107 controls the output transistor 105 on the basis of a result of comparison between the reference voltage Vref and the feedback voltage Vfb according to the output voltage Vout. That is, the differential amplifier 107 receives inputs of the reference voltage Vref and the feedback voltage Vfb, generates a control voltage Vcnt such that the difference voltage (Vref−Vfb) approaches zero, and outputs the control voltage Vcnt as an output signal from the output node 107a to the gate electrode of the transistor 105.

The filter 108 is provided between the input terminal 101 and the output transistor 105, and is connected to the control node 107b of the differential amplifier 107. That is, the filter 108 is provided between the output transistor 105 and the control node 107b, a node that makes a pair with the single end of the differential amplifier 107.

The filter 108 includes at least one phase variable element. For example, the filter 108 includes at least one or more capacitor elements or inductor elements. The filter 108 varies the phase supplied from the control node 107b to the source electrode of the output transistor 105.

Figure 2:
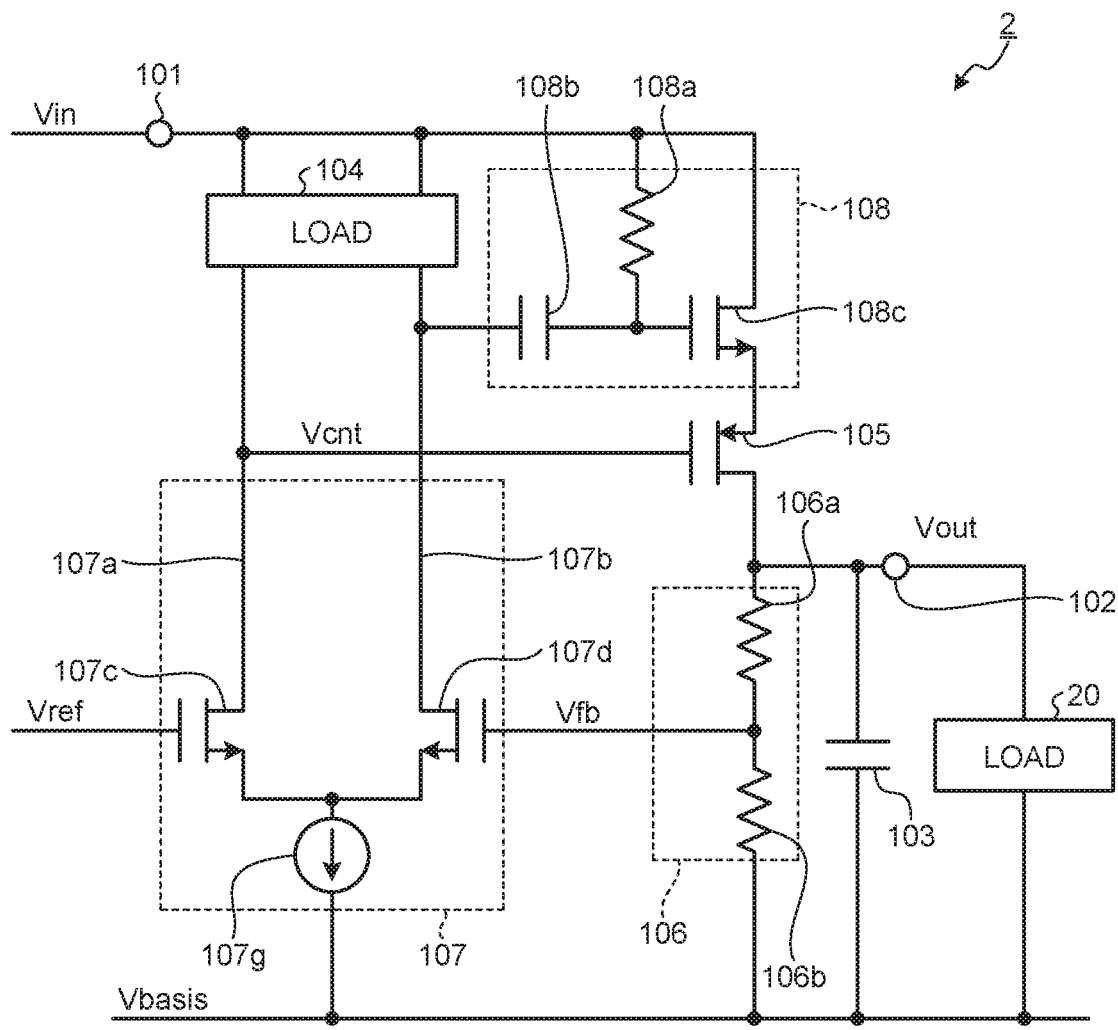
FIG. 2 illustrates a regulator circuit 2 as an example of a circuit diagram of the regulator circuit 1 illustrated in FIG. 1.

FIG. 2 illustrates a regulator circuit 2 as an example of a circuit diagram of the regulator circuit 1 illustrated in FIG. 1.

As illustrated in FIG. 2, the feedback circuit 106 includes voltage divider resistors 106a and 106b. The voltage at a connecting point between the voltage divider resistors 106a and 106b (that is, the voltage obtained by dividing the output voltage Vout at a ratio depending on the resistance values of the voltage divider resistors 106a and 106b) is input as the feedback voltage Vfb to the input terminal of the differential amplifier 107.

The output transistor 105 is a P-channel type MOSFET as a low withstand voltage element.

The input voltage Vin that has passed through the filter 108 is applied to the source electrode of the output transistor 105. The control voltage Vcnt from the differential amplifier 107 is applied to the gate electrode of the output transistor 105. The drain electrode of the output transistor 105 is connected to the output terminal 102 and to one end of a voltage divider resistor 106a. The other end of the voltage divider resistor 106a is connected to Vbasis via the voltage divider resistor 106b.

The differential amplifier 107 includes two N-channel type MOSFETs 107c and 107d as low withstand voltage elements, and a current source 107g. The feedback voltage Vfb from the feedback circuit 106 is input to the gate electrode of one N-channel type MOSFET 107d (that is, to an input terminal V− of the differential amplifier 107). The reference voltage Vref is input to the gate electrode of the other N-channel MOSFET 107c (that is, to an input terminal V+ of the differential amplifier 107).

The filter 108 is a high-pass filter including a resistor 108a, a capacitor 108b, and a transistor 108c (second transistor) as a low withstand voltage element similar to the output transistor 105 as a low withstand voltage element.

A second drain electrode of the transistor 108c is connected to the input terminal 101. A second gate electrode of the transistor 108c is connected to the resistor 108a and the capacitor 108b. A second source electrode of the transistor 108c is connected to the source electrode of the output transistor 105.

The frequency band allowed to pass by the filter 108 can be adjusted by a resistance value R of the resistor 108a and capacitance C of the capacitor 108b.

The above is a configuration example in which the filter 108 includes one resistor 108a and one capacitor 108b. However, the numbers of the resistors 108a and the capacitors 108b can be arbitrarily selected according to the purpose.

Figure 3:
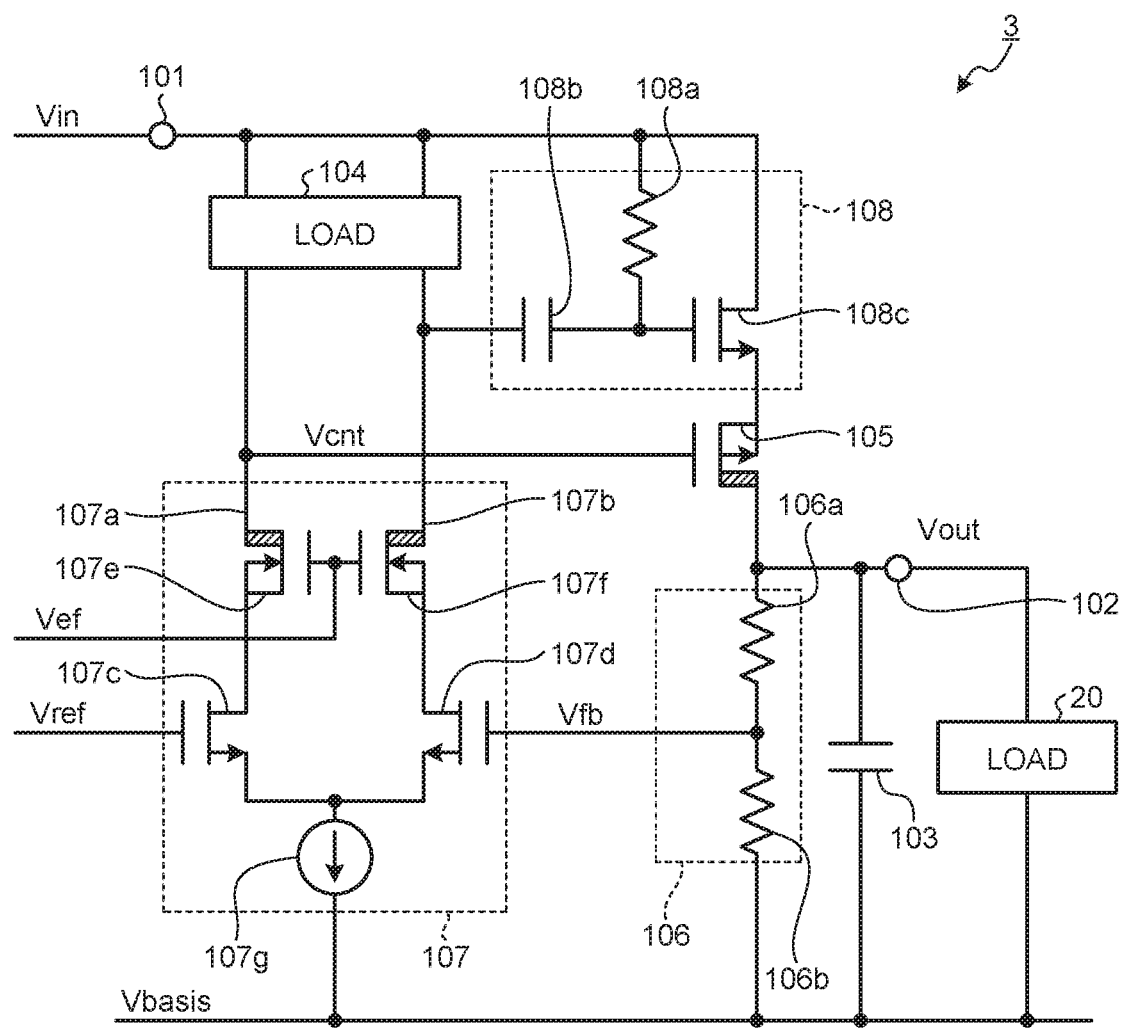
FIG. 3 illustrates a regulator circuit 3 as another example of the circuit diagram of the regulator circuit 1 illustrated in FIG. 1.

FIG. 3 illustrates a regulator circuit 3 as another example of the circuit diagram of the regulator circuit 1 illustrated in FIG. 1, as an example in the case of Vin>>>Vbasis in the circuit diagram of the regulator circuit 1 illustrated in FIG. 1. As illustrated in FIG. 3, the differential amplifier 107 may include two N-channel MOSFETs 107c and 107d as low withstand voltage elements, a current source 107g, and two N-channel MOSFETs 107e and 107f as high withstand voltage elements. Note that a part of the output transistor 105 and a part of the MOSFETs 107e and 107f included in the differential amplifier 107 illustrated in FIG. 3 are thick and hatched to indicate that the element is a high withstand voltage element. The similar applies to the following figures. That is, the configuration may be any configuration as long as there is provided at least one MOSFET as a high withstand voltage element between the input voltage Vin and Vbasis via the output node 107a of the differential amplifier 107, between the input voltage Vin and Vbasis via the control not 107b, and between the input voltage Vin and Vbasis via the output transistor.

(Operation)

Next, operation of the regulator circuit 1 will be described in comparison with a comparative example.

Figure 4:
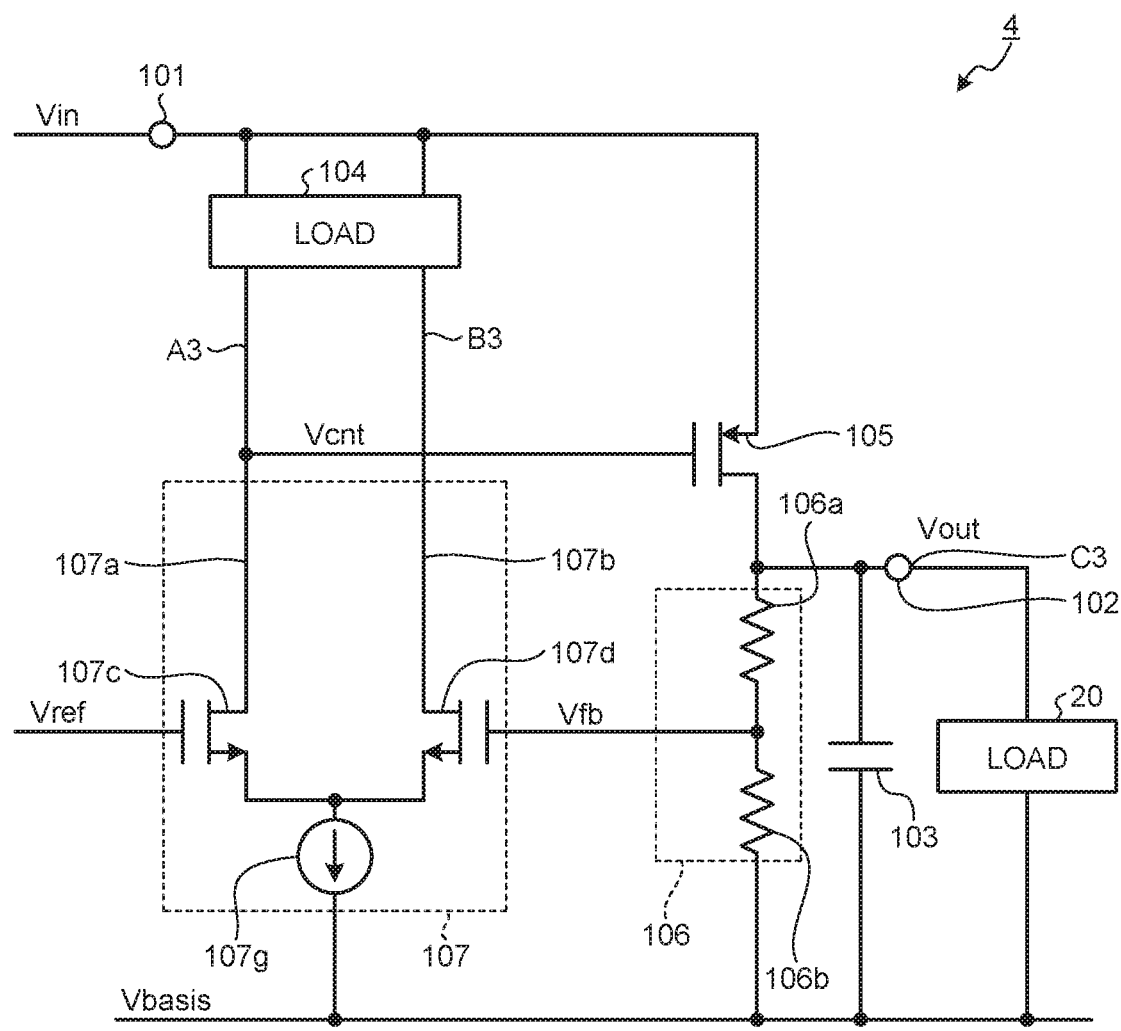
FIG. 4 is a diagram illustrating a regulator circuit 4 as a comparative example of the regulator circuit 2.

FIG. 4 is a diagram illustrating a regulator circuit 4 as a comparative example of the regulator circuit 1. As illustrated in FIG. 4, the regulator circuit 4 has a configuration that has removed the filter 108 from the regulator circuit 2 illustrated in FIG. 2.

Figure 5:
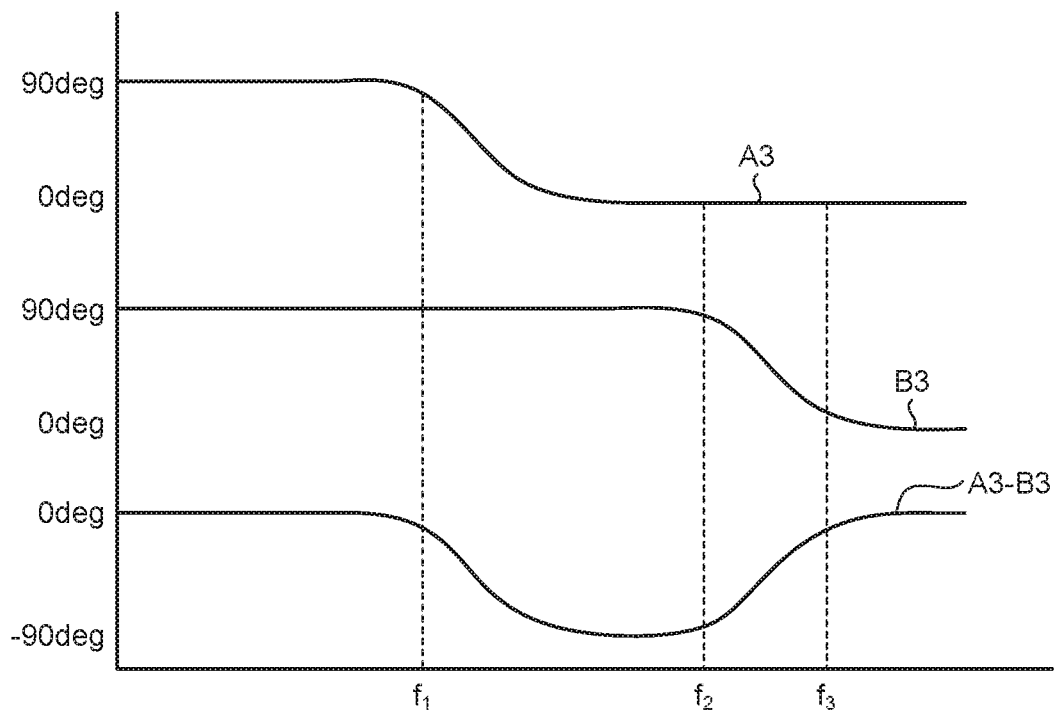
FIG. 5 is a graph illustrating a phase of a ripple component due to an AC voltage at each of nodes A3 and B3 in a case where an input voltage Vin obtained by superimposing an AC voltage on a DC voltage is supplied to an input terminal of the regulator circuit 4 as the comparative example illustrated in FIG. 4.
Figure 6:
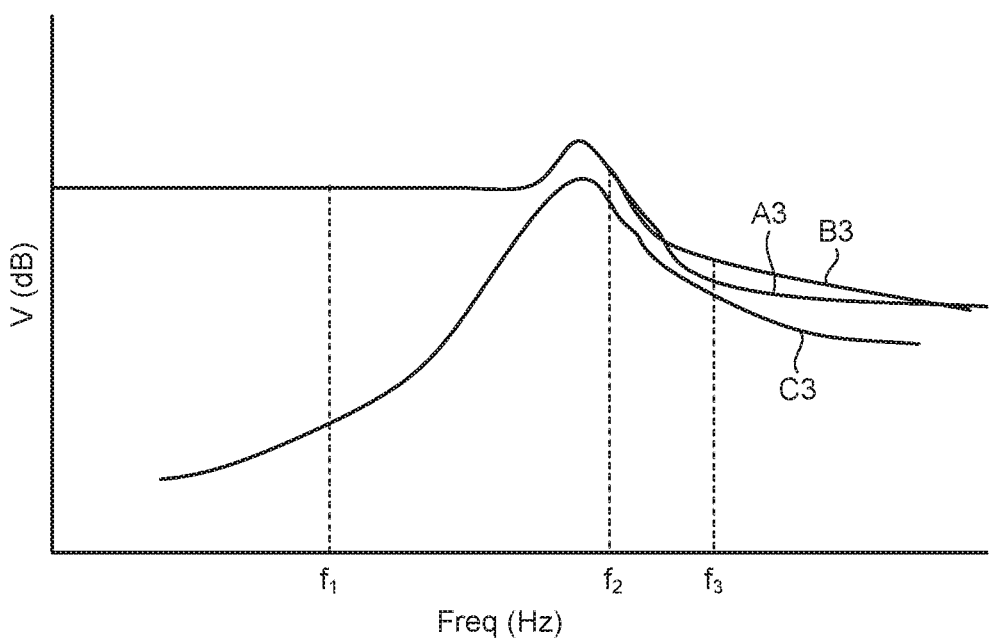
FIG. 6 is a graph illustrating a Power Supply rejection Ratio (PSRR) at each of nodes A3, B3, and C3 of the regulator circuit 4 as the comparative example illustrated in FIG. 4.

FIG. 5 is a graph illustrating a phase of a ripple component due to an AC voltage at each of nodes A3 and B3 in a case where an input voltage Vin obtained by superimposing an AC voltage on the DC voltage is supplied to the input terminal 101 of the regulator circuit 4 as the comparative example illustrated in FIG. 4. FIG. 6 is a graph illustrating PSRRs at individual nodes A3, B3, and C3 of the regulator circuit 4 as the comparative example illustrated in FIG. 4.

As illustrated in FIG. 5, the ripple components at each of the nodes A3 and B3 of the regulator circuit 4 have phase inflection start points at different frequencies f1 and f2, respectively. When comparing the frequency characteristics of the phases at each of the nodes A3 and B3, there is a phase difference between each of the nodes A3 and B3 in the frequency band between f1 as a phase inflection start point of the node A3 and f3 as a phase inflection end point of the node B3.

The phase shift in the frequency band between f1 and f3 at each of the nodes A3 and B3 occurs for the following reason. That is, while the output transistor 105 is connected to the node A3, the output transistor 105 is not connected to the node B3. In such a connection relationship, there would be no problem when the ripple component flowing through each of the nodes A3 and B3 has a low frequency. However, when the ripple component has a high frequency, there would be a significant influence of a load of the output transistor 105 having a capacitance as a capacitor. This would result in an unbalanced load between the nodes A3 and B3, causing a shift in the phase response to the frequency between the nodes A3 and B3.

As illustrated in FIG. 6, PSRR characteristics have a correlation between the nodes A3 and B3 in the PSRRs at each of the nodes A3, B3, and C3 of the regulator circuit 4. The node C3 has a local maximum of the PSRR characteristic in the frequency band between f1 and f3.

Figure 7:
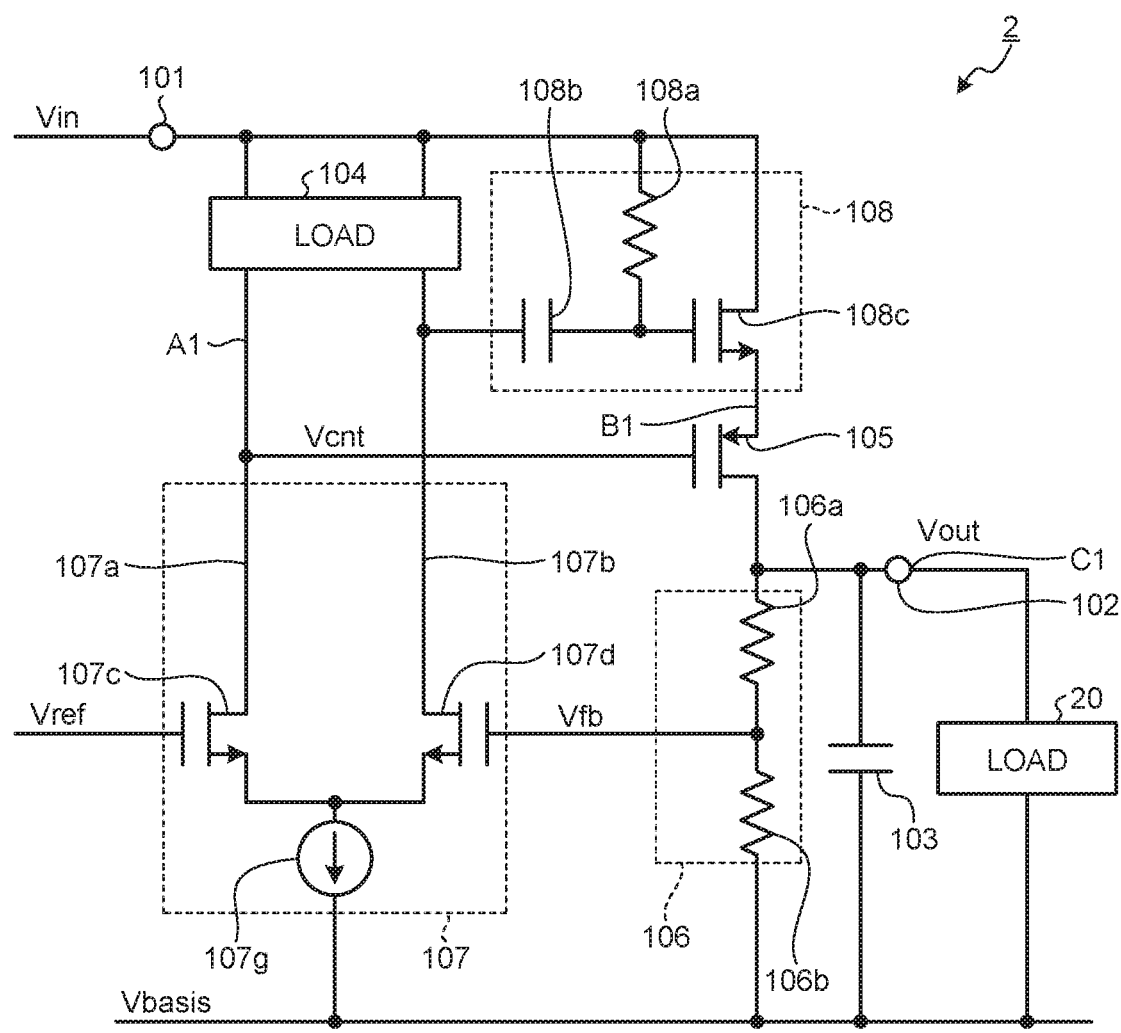
FIG. 7 is a diagram illustrating each of nodes on the regulator circuit 2 illustrated in FIG. 2.
Figure 8:
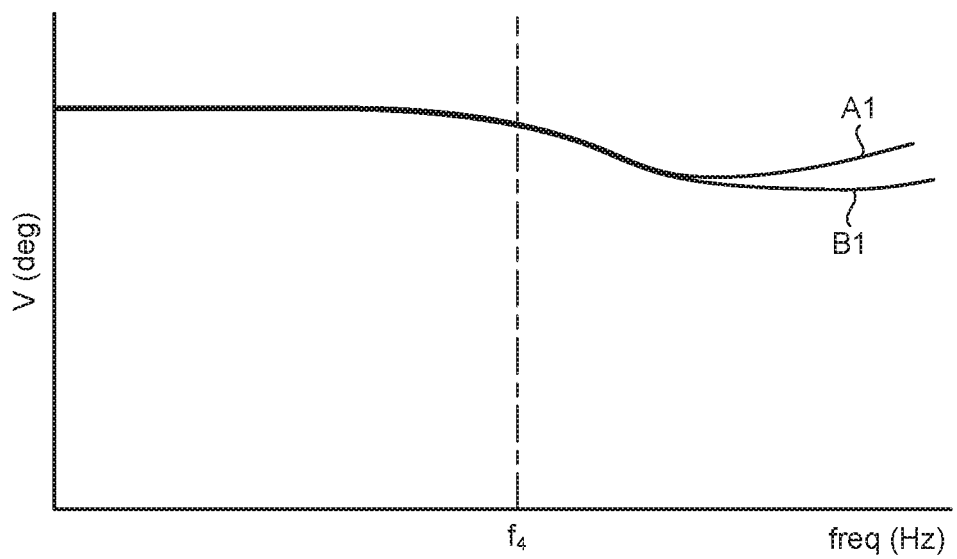
FIG. 8 is a graph illustrating a phase of a ripple component due to an AC voltage at each of nodes A1 and B1 in a case where an input voltage obtained by superimposing an AC voltage on the DC voltage is supplied to an input terminal of the regulator circuit 2 illustrated in FIG. 7.
Figure 9:
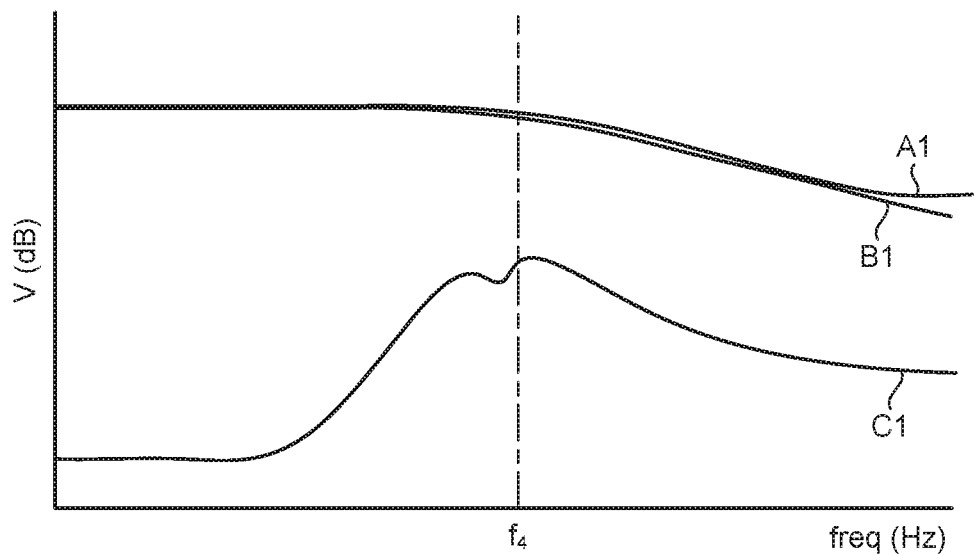
FIG. 9 is a graph illustrating PSRR at each of nodes A1, B1, and C1 of the regulator circuit 2 illustrated in FIG. 7.
Figure 10:
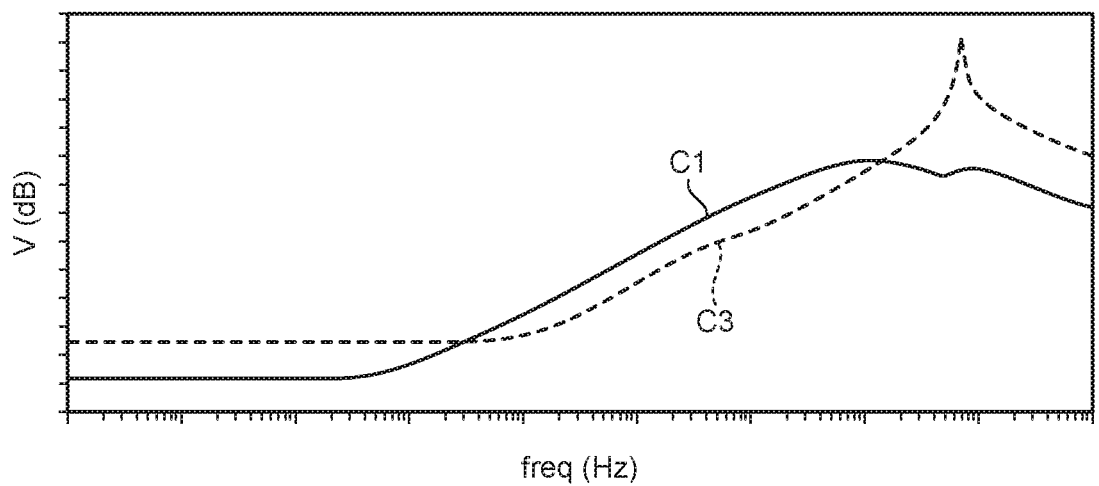
FIG. 10 is a graph as separate extractions of PSRR at node C3 of the regulator circuit 4 in FIG. 6 and PSRR at node C1 of the regulator circuit 2 in FIG. 9.

FIG. 7 is a diagram illustrating the nodes A1, B1, and C1 on the regulator circuit 2 illustrated in FIG. 2. FIG. 8 is a graph illustrating a phase of a ripple component due to an AC voltage at each of nodes A1 and B1 in a case where an input voltage Vin obtained by superimposing an AC voltage on the DC voltage is supplied to the input terminal 101 of the regulator circuit 2 illustrated in FIG. 7. FIG. 9 is a graph illustrating PSRR at each of nodes A1, B1, and C1 of the regulator circuit 2 illustrated in FIG. 7. FIG. 10 is a graph as separate extractions of PSRR at node C3 of the regulator circuit 4 in FIG. 6 and PSRR at node C1 of the regulator circuit 2 in FIG. 9.

As illustrated in FIG. 8, the ripple component at each of the nodes A1 and B1 of the regulator circuit 2 has a phase inflection point in the neighborhood of frequency f4. Therefore, the ripple components at each of the nodes A1 and B1 of the regulator circuit 2 have no inflection point position shift as compared with the ripple components illustrated in FIG. 5, and the phase shift in the ripple components has been reduced.

The reason why no phase shift occurs between the nodes A1 and B1 of the regulator circuit 2 is as follows. That is, the output transistor 105 is connected to the A1 node side, while the filter 108 including the capacitor 108b is connected to the node B1 side. Such a connection relationship achieves a balanced load between the node A1 and the node B1.

Therefore, in a case where there is a significant influence of a load of the output transistor 105 having a capacitance as a capacitor when the ripple component has a high frequency, and where a ripple component phase shift of a degrees (for example, 90 degrees) occurs at the node A1, the ripple component at node B1 would have a phase shift of Q degrees (for example, 90 degrees) with respect to a degrees at the similar frequency f4 due to the load of the capacitor 108b. Therefore, the ripple component phase shift between each of the nodes A1 and B1 of the regulator circuit 1 is reduced.

In other words, the filter 108 reduces a phase difference and an amplitude difference between the voltage applied to the source electrode of the output transistor 105 and the voltage applied to the gate electrode of the output transistor 105 in the frequency response characteristics between the output node 107a and the control node 107b and thereby suppresses the variation in the voltage difference between the gate electrode and the source electrode of the output transistor 105.

The capacitance of the capacitor 108b of the filter 108 and the resistance value of the resistor 108a can be determined on the basis of a frequency band having the ripple component phase shift of a degrees (for example, 90 degrees) at the node A1.

As illustrated in FIGS. 9 and 10, when comparing the PSRR at the node C1 of the regulator circuit 2 with the PSRR at the node C3 of the regulator circuit 4 illustrated in FIG. 6, the local maximum of the PSRR at the node C1 of the regulator circuit 2 is significantly lower than the local maximum of the PSRR at the node C3 of the regulator circuit 4. This indicates that the PSRR at the node C1 of the regulator circuit 2 is significantly improved as compared with the PSRR at the node C3 of the regulator circuit 4. This is because the regulator circuit 2 has a configuration connecting the capacitor 108b to the source electrode of the output transistor 105, and thus, the phase of the ripple component input to the source electrode is shifted by @ degrees (for example, 90 degrees), leading to elimination of the phase shift between the ripple component in B1 and the ripple component in A1.

The amplitude of the ripple component at the node A1 of the regulator circuit 1 is substantially equal to the amplitude of the ripple component at the node B1 of the regulator circuit 1, but can be adjusted by the filter loss of the filter 108 as necessary.

Figure 11:
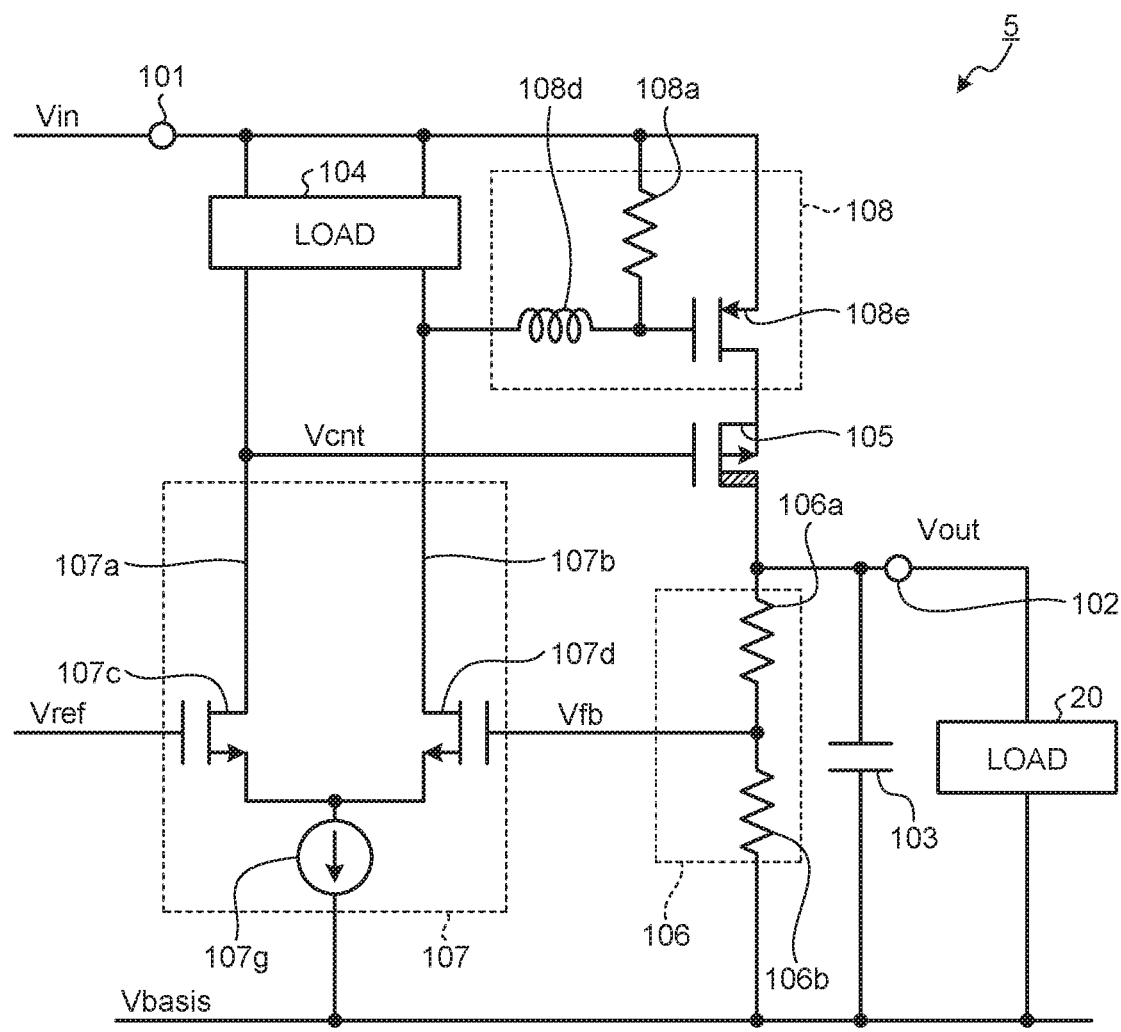
FIG. 11 illustrates a regulator circuit 5 as an example in which a filter 108 is a low-pass filter including a resistor, an inductor element, and a P-type transistor as a low withstand voltage element.

FIG. 11 illustrates a regulator circuit 5 as an example in which the filter 108 is a low-pass filter including the resistor 108a, an inductor element 108d, and a P-type transistor 108e (second transistor) as a low withstand voltage element.

In the filter 108 illustrated in FIG. 11, even when the ripple component phase shift of a degrees (for example, 90 degrees) occurs at the output node 107a, the ripple component phase shift with respect to a degrees is y degrees (for example, 90 degrees) in opposite shift by the load of the inductor element 108d. Furthermore, the polarity of the ripple component is inverted (for example, the phase is inverted by 180 degrees) by the P-type transistor 108e. This leads to reduction of the phase shift of the ripple component applied to the gate electrode and the source electrode of the output transistor.

Therefore, with the presence of the filter 108 including the resistor 108a, the inductor element 108d, and the P-type transistor 108e as a low withstand voltage element, it is also possible, in the frequency response characteristics between the output node 107a and the control node 107b, to reduce the phase difference and amplitude difference between the voltage applied to the source electrode of the output transistor 105 and the voltage applied to the gate electrode of the output transistor 105, leading to suppression of the variation of the voltage difference between the gate electrode and the source electrode of the output transistor 105.

Note that the frequency band allowed to pass by the filter 108 illustrated in FIG. 11 can be adjusted by the resistance value R of the resistor 108a and the inductance of the inductor element 108d.

The regulator circuit 1 according to the embodiment described above includes the output transistor 105 as the first transistor provided between the input terminal 101 on the power supply input side and the output terminal 102 on the output side, the differential amplifier 107 that includes an output node 107a connected to the output transistor 105 and that controls the output transistor 10 on the basis of a result of comparison between the reference voltage Vref and the feedback voltage Vfb corresponding to the output voltage Vout applied to the output terminal 102, and the filter 108 connected to the control node 107b of the differential amplifier 107, the node that makes a differential pair with the output node 107a. Moreover, the filter 108 includes at least one or more capacitor elements or inductor elements, for example.

The voltage input from the control node 107b to the output transistor 105 via the filter 108 has a substantially same level of frequency as the voltage of the node A1 with the phase shifted by β degrees (for example, 90 degrees) to the same phase, due to the capacitor 108b of the filter 108 in a case where the frequency of the ripple component becomes high. Accordingly, it is possible to reduce the phase difference and the amplitude difference between the voltage input from the output node 107a to the output transistor 105. This accordingly makes it possible to improve the frequency response characteristics of the output node 107a and the control node 107b, and a voltage with a reduced phase difference and amplitude difference will be applied to each of electrodes of the output transistor 105. This results in achievement of suppression of the variation of the voltage difference between the electrodes in the output transistor 105 as compared with the conventional technique, leading to improvement of the PSRR of the regulator circuit 1.

In general, in a case where the potential difference between the power supply voltage Vdd and the output voltage Vout is Vdd>>>Vbasis when the regulator circuit is used, for example, a high withstand voltage element having a high withstand voltage characteristic would be required. This would increase the number of amplifiers and high withstand voltage elements in order to achieve the regulator circuit by the conventional technique. In this case, the installation area of the high withstand voltage element would be larger than that of the low withstand voltage element, leading to enlargement of the circuits.

According to the regulator circuit 1 of the present embodiment, there is no need to provide a new bias path or add a high withstand voltage element having a large circuit area in the case of improving the PSRR of a regulator circuit used for a high withstand voltage power supply. Therefore, it is possible to provide a linear regulator circuit and an electronic device capable of achieving a high performance over a wide frequency range with significantly improved PSRR rather than the related art without increasing the circuit area.

Furthermore, with the filter 108 adjusted in the element values, it is possible to easily design the regulator circuit 1 with improved PSRR.

Furthermore, with the improved PSRR of the regulator circuit 1, it is possible to prevent malfunction of an electronic device to which the output voltage Vout from the regulator circuit 1 is supplied.

(First Modification)

The above embodiment has exemplified a case where the output transistor 105 is a P-type MOS. However, the present invention is not limited to this example, and the output transistor 105 may be an N-type MOS.

Figure 12:
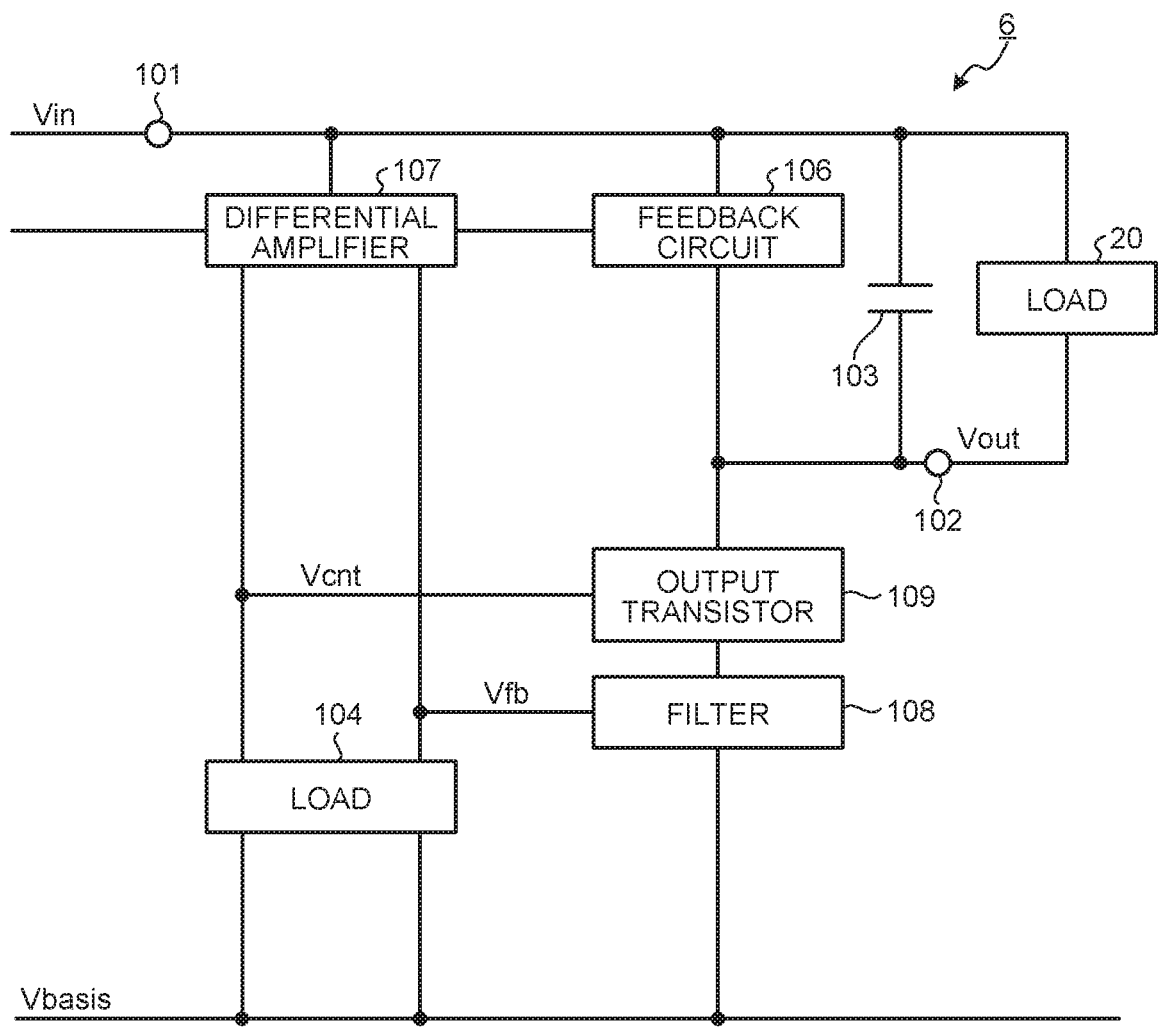
FIG. 12 is a diagram illustrating a configuration of a regulator circuit 6 according to a first modification.

FIG. 12 is a diagram illustrating a configuration of a regulator circuit 6 according to a first modification. As illustrated in FIG. 12, in a case where the output transistor 109 is an N-type MOS, the circuit in the regulator circuit 6 is upside down compared to the regulator circuit 1 illustrated in FIG. 1.

(Second Modification)

The above embodiment is an exemplary case where the regulator circuit 1 is a linear regulator. However, the present invention is not limited to this example, and improvement over the PSRR using the filter 108 is applicable also to a switching regulator.

Figure 13:
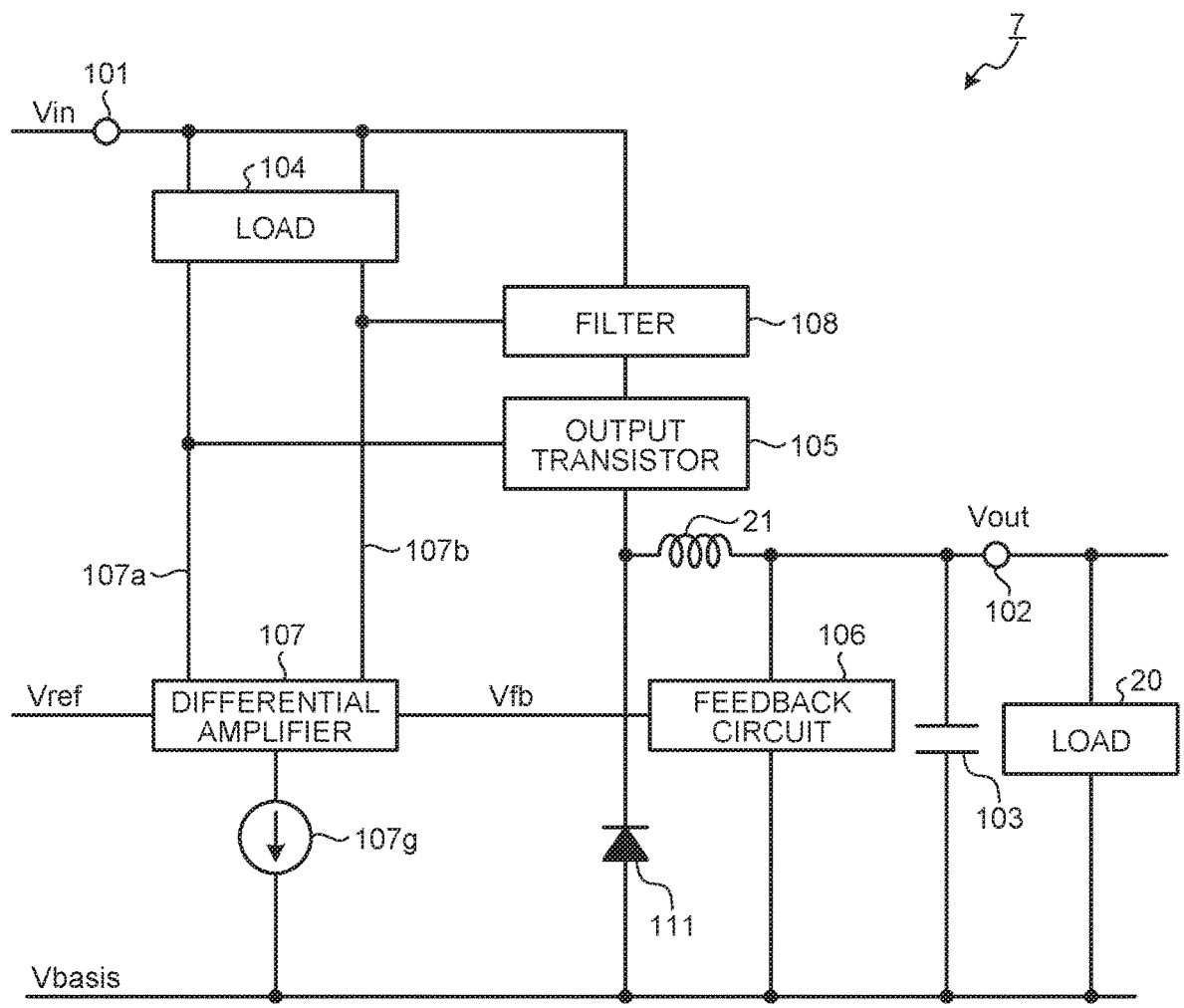
FIG. 13 is a diagram illustrating a regulator circuit 7 as a switching regulator according to a second modification.

FIG. 13 is a diagram illustrating a regulator circuit 7 as a switching regulator according to a second modification. As illustrated in FIG. 13, the regulator circuit 7 has a configuration in which a diode 111 and an inductor 21 are further connected to the output terminal 102, as compared with the regulator circuit 1 illustrated in FIG. 1.

When the configuration according to the present embodiment is applied to a switching regulator as in the second modification, it is particularly effective in applications requiring a withstand voltage, making it possible to significantly improve PSRR without increasing the circuit area.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A regulator circuit comprising:
a first transistor provided between an input terminal on a power supply input side and an output terminal on an output side;
a differential amplifier that includes an output node connected to the first transistor and that controls the first transistor on the basis of a result of comparison between a reference voltage and a feedback voltage corresponding to an output voltage applied to the output terminal; and
a filter connected to a control node of the differential amplifier, the control node making a differential pair with the output node,
wherein the first transistor includes:
a first gate electrode connected to the output node of the differential amplifier;
a first source electrode connected to the filter; and
a first drain electrode connected to the output terminal, and
the filter reduces a phase difference and an amplitude difference between a voltage applied to the first source electrode of the first transistor and a voltage applied to the first gate electrode of the first transistor in a frequency response characteristic between the output node and the control node, and suppresses a variation of a voltage difference between the first gate electrode and the first source electrode, in the first transistor.

2. The regulator circuit according to claim 1,
wherein the filter comprises a second transistor including:
a second drain electrode connected to the input terminal or the first source electrode of the first transistor;
a second gate electrode connected to the control node of the differential amplifier; and
a second source electrode connected to the other node with respect to a node to which the second drain electrode is connected, among the input terminal or the first source electrode of the first transistor.

3. The regulator circuit according to claim 2, wherein the filter includes at least one element that changes a phase.

4. The regulator circuit according to claim 3, wherein the element that changes a phase is a capacitor element.

5. The regulator circuit according to claim 4, wherein the filter includes:
a capacitor element as the element that changes the phase connected between the second gate electrode of the second transistor and the control node of the differential amplifier; and
an inductor element or a resistor element connected between the input terminal and the second gate electrode of the second transistor.

6. The regulator circuit according to claim 3, wherein the element that changes the phase is an inductor element.

7. The regulator circuit according to claim 6, wherein the filter includes:
an inductor element as the element that changes the phase connected between the second gate electrode of the second transistor and the control node of the differential amplifier; and
an inductor element or a resistor element connected between the input terminal and the second gate electrode of the second transistor.

8. The regulator circuit according to claim 2, wherein the first source electrode of the first transistor is connected to the second source electrode of the second transistor of the filter.

9. The regulator circuit according to claim 2, wherein the first source electrode of the first transistor is connected to the second drain electrode of the second transistor of the filter.

10. The regulator circuit according to claim 2, wherein the first transistor is a higher withstand voltage element compared to the second transistor, and the second transistor is a lower withstand voltage element compared to the first transistor.

11. A semiconductor device comprising an integrated circuit forming a regulator circuit,
wherein the regulator circuit includes:
a first transistor provided between an input terminal on a power supply input side and an output terminal on an output side;
a differential amplifier that includes an output node connected to the first transistor and that controls the first transistor on the basis of a result of comparison between a reference voltage and a feedback voltage corresponding to an output voltage applied to the output terminal; and
a filter connected to a control node of the differential amplifier, the control node making a differential pair with the output node,
wherein the first transistor includes:
a first gate electrode connected to the output node of the differential amplifier;
a first source electrode connected to the filter; and
a first drain electrode connected to the output terminal, and
the filter reduces a phase difference and an amplitude difference between a voltage applied to the first source electrode of the first transistor and a voltage applied to the first gate electrode of the first transistor in a frequency response characteristic between the output node and the control node, and suppresses a variation of a voltage difference between the first gate electrode and the first source electrode, in the first transistor.

12. The semiconductor device according to claim 11, wherein the filter includes a second transistor including:
a second drain electrode connected to the input terminal or the first source electrode of the first transistor;
a second gate electrode connected to the control node of the differential amplifier; and
a second source electrode connected to the other node with respect to a node to which the second drain electrode is connected, among the input terminal or the first source electrode of the first transistor.

13. An electronic device including a semiconductor device,
wherein the semiconductor device includes an integrated circuit forming a regulator circuit, and
the regulator circuit includes:
a first transistor provided between an input terminal on a power supply input side and an output terminal on an output side;
a differential amplifier that includes an output node connected to the first transistor and that controls the first transistor on the basis of a result of comparison between a reference voltage and a feedback voltage corresponding to an output voltage applied to the output terminal; and
a filter connected to a control node of the differential amplifier, the control node making a differential pair with the output node,
wherein the first transistor includes:
a first gate electrode connected to the output node of the differential amplifier;
a first source electrode connected to the filter; and
a first drain electrode connected to the output terminal, and
the filter reduces a phase difference and an amplitude difference between a voltage applied to the first source electrode of the first transistor and a voltage applied to the first gate electrode of the first transistor in a frequency response characteristic between the output node and the control node, and suppresses a variation of a voltage difference between the first gate electrode and the first source electrode, in the first transistor.

14. The electronic device according to claim 13, wherein the filter includes a second transistor including:
a second drain electrode connected to the input terminal or the first source electrode of the first transistor;
a second gate electrode connected to the control node of the differential amplifier; and
a second source electrode connected to the other node with respect to a node to which the second drain electrode is connected, among the input terminal or the first source electrode of the first transistor.

* * * * *